(12) United States Patent
Yoo (10) Patent No.: US 7,768,852 B2
(45) Date of Patent: Aug. 3, 2010

(54) PRECHARGE CONTROL CIRCUIT IN SEMICONDUCTOR MEMORY APPARATUS

(75) Inventor: Seong Nyuh Yoo, Ichon (KR)

(73) Assignee: Hynix Semiconductor Inc. (KR)

( * ) Notice: Subject to any disclaimer, the term of this patent is extended or adjusted under 35 U.S.C. 154(b) by 352 days.

(21) Appl. No.: 12/026,415

(22) Filed: Feb. 5, 2008

(65) Prior Publication Data

US 2009/0059700 A1    Mar. 5, 2009

(30) Foreign Application Priority Data

Sep. 5, 2007    (KR) ...................... 10-2007-0089884

(51) Int. Cl.
*G11C 29/00* (2006.01)
(52) U.S. Cl. .................. 365/203; 365/233.18
(58) Field of Classification Search ................. 365/203, 365/233.18, 233.1
See application file for complete search history.

(56) References Cited

U.S. PATENT DOCUMENTS

| | | | | |
|---|---|---|---|---|
| 5,631,871 | A * | 5/1997 | Park et al. | .................... 365/203 |
| RE36,532 | E * | 1/2000 | Kim | ............................ 365/203 |
| 6,317,852 | B1 | 11/2001 | Lau et al. | |
| 6,633,504 | B1 | 10/2003 | Lee et al. | |
| 6,757,214 | B2 | 6/2004 | Kawaguchi et al. | |
| 6,771,558 | B2 * | 8/2004 | Kim | ....................... 365/233.18 |
| 7,065,000 | B2 | 6/2006 | An | |
| 7,518,938 | B2 * | 4/2009 | Yoo | ............................ 365/203 |
| 2003/0185075 | A1 | 10/2003 | Park et al. | |
| 2006/0002225 | A1 | 1/2006 | An | |

FOREIGN PATENT DOCUMENTS

| | | |
|---|---|---|
| JP | 11203869 | 7/1999 |
| JP | 2002133866 | 5/2002 |
| JP | 2003068091 | 3/2003 |
| JP | 2005116167 | 4/2005 |
| JP | 2005302252 | 10/2005 |
| KR | 1020000008774 | 2/2000 |
| KR | 1020020002621 | 1/2002 |
| KR | 1020020082534 | 10/2002 |

\* cited by examiner

*Primary Examiner*—Tuan T Nguyen
*Assistant Examiner*—R Lance Reidlinger
(74) *Attorney, Agent, or Firm*—Baker & McKenzie LLP (57) ABSTRACT

A precharge circuit in a semiconductor memory apparatus includes a burst setting unit for controlling a state of a burst setting signal using delay elements in response to a burst start signal, wherein the delay elements operate in synchronization with a clock signal when the burst setting signal is deactivated, a burst termination unit for generating a burst termination signal in response to the burst setting signal, a precharge control unit for generating a read precharge control signal and a write precharge control signal in response to the burst termination signal, and a precharge signal generating unit for generating a precharge signal using the read precharge control signal or the write precharge control signal according to a read or write operation.

19 Claims, 5 Drawing Sheets

PRECHARGE CONTROL CIRCUIT IN SEMICONDUCTOR MEMORY APPARATUS

CROSS-REFERENCE TO RELATED PATENT APPLICATION

This application claims the benefit under 35 U.S.C 119(a) of Korean Application No. 10-2007-0089884, filed on Sep. 5, 2007, in the Korean Intellectual Property Office, the disclosure of which is incorporated herein in its entirety by reference as if set forth in full.

BACKGROUND

1. Technical Field

The embodiments described herein relate to a semiconductor memory apparatus and, more particularly, to a precharge control circuit capable of improving operational stability of a semiconductor memory apparatus.

2. Related Art

A conventional semiconductor memory apparatus receives commands to perform active and precharge operations. An active operation typically includes a read or write operation. A conventional semiconductor memory apparatus outputs data from a memory cell during a read operation and inputs data to the memory cell during a write operation. When one active operation is finished, the data signals still remain on bit lines and data I/O lines, which performed data I/O operations. Thus, for smooth performance of the next active operation, the signal lines should be precharged to a predetermined level. Therefore, the semiconductor memory apparatus includes a precharge control circuit to precharge each signal line during an interval between active operations.

In a conventional semiconductor apparatus, a precharge control circuit automatically generates a precharge signal a predetermined time after an active operation is completed. The time between the performance of the active operation and the generation of the precharge signal is determined by delay elements, which are included in the precharge control circuit.

A conventional precharge control circuit includes delay elements that provide a constant delay regardless of a clock frequency. Thus, if the clock frequency is changed, then the precharge signal may not be generated at the correct time. Further, when the precharge operations for consecutive write operations are performed, a precharge control signal, which should be generated once, may be generated twice due to the signal timing change, which is caused by the change of the clock frequency. If the precharge signals are generated twice, then waiting time for the write operation can be increased significantly.

Since a conventional precharge control circuit cannot properly cope with a change in the clock frequency, particularly when the clock frequency is high, high speed operation can be limited. Also, since a conventional precharge control circuit cannot properly control the precharge timings for consecutive write operations, it can fail to provide operational stability.

SUMMARY

A precharge control circuit capable of stably operating a semiconductor memory apparatus despite a change in a clock frequency is described herein. A precharge control circuit capable of efficiently supporting a high speed semiconductor memory apparatus by improving adaptability to a high clock frequency is also described.

According to one aspect, there is provided a precharge control circuit in a semiconductor memory apparatus, comprising: a burst setting unit for controlling a state of a burst setting signal using delay elements in response to a burst start signal, wherein the delay elements operate in synchronization with a clock when the burst setting signal is deactivated, a burst termination unit for generating a burst termination signal in response to the burst setting signal, a precharge control unit for generating a read precharge control signal and a write precharge control signal in response to the burst termination signal, and a precharge signal generating unit for generating a precharge signal using the read precharge control signal or the write precharge control signal according to a read or write operation.

According to another aspect, there is provided a precharge control circuit in a semiconductor memory apparatus comprising a burst setting unit for generating a burst setting signal in response to a burst start signal, a burst termination unit for generating a burst termination signal in response to the burst setting signal a precharge control unit for variably delaying an output of a voltage of a first node, which is generated in response to the burst start signal, according to a read or write operation and generating a read precharge control signal and a write precharge control signal by combining the burst termination signal and the voltage output from the first node, and a precharge signal generating unit for generating a precharge signal using the read precharge control signal or the write precharge control signal according to the read or write operation.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
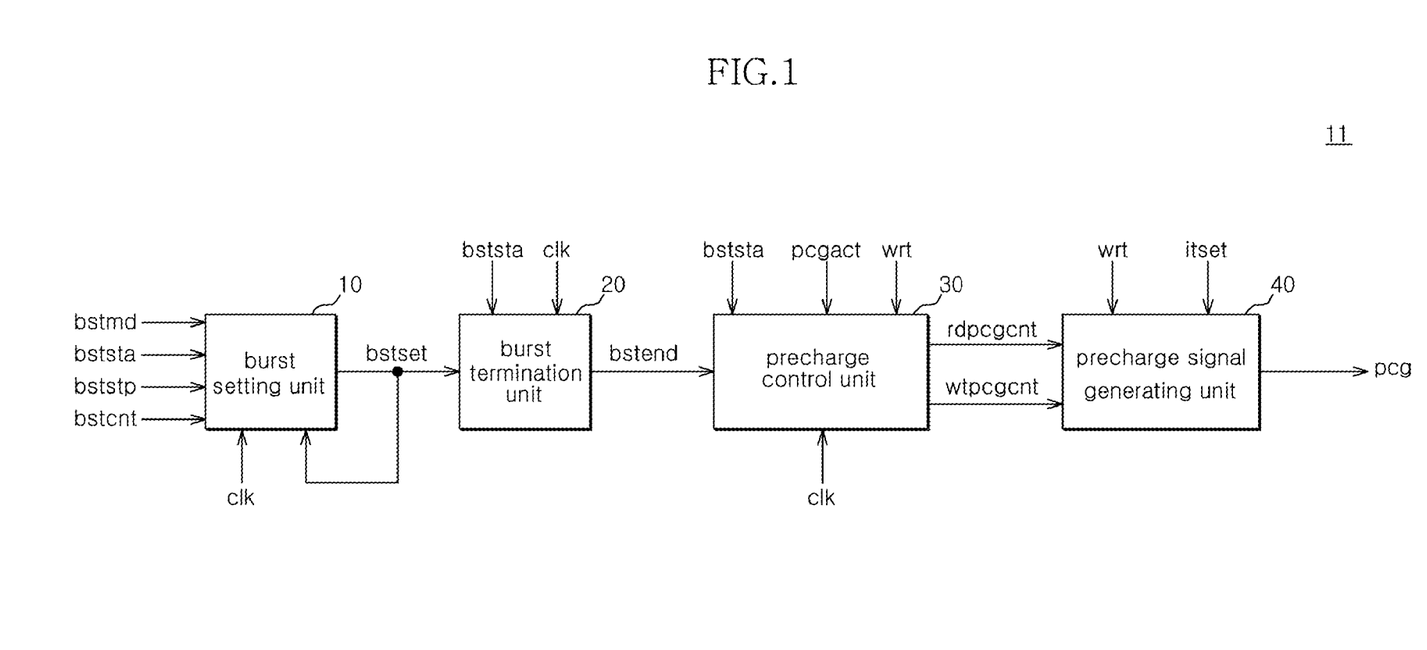
FIG. 1 is a block diagram illustrating a precharge control circuit in a semiconductor memory apparatus according to one embodiment.

FIG. 1 is a diagram illustrating an example precharge control circuit 11 configured in accordance with one embodiment. Referring to FIG. 1, it can be seen that the precharge control circuit 11 can include a burst setting unit 10, a burst termination unit 20, a precharge control unit 30 and a precharge signal generating unit 40.

The burst setting unit 10 can receive a clock signal 'clk', a burst mode signal 'bstmd', a burst start signal 'bststa', a burst stop signal 'bststp', a burst control signal 'bstcnt' and a fed back burst setting signal 'bstset' and can be configured to generate the burst setting signal 'bstset' based thereon. When the burst start signal 'bststa' is activated, the burst setting unit 10 can be configured to start operating and receive the fed back burst setting signal 'bstset'. When the burst setting signal 'bstset' is deactivated, the burst setting unit 10 can be configured to use delay elements, which operate in synchronization with the clock signal 'clk', to control the state of the burst setting signal 'bstset'.

The delay elements included in the burst setting unit 10 can be configured such that they do not operate in synchronization with the clock signal 'clk' when the burst setting signal 'bstset' is activated. Thus, the activation timing of the burst setting signal 'bstset' can be stably controlled by the clock signal 'clk'. Also, the deactivation timing of the burst setting signal 'bstset' can speed up. Therefore, the activation timing of the burst setting signal 'bstset' can be determined in response to the frequency change of the clock signal 'clk' and the reset timing, i.e., the time needed to wait for the next command, can be sped up.

The burst termination unit 20 can be configured to generate a burst termination signal 'bstend' in response to the burst start signal 'bststa', the clock signal 'clk' and the burst setting signal 'bstset'.

The precharge control unit 30 can be configured to generate a read precharge control signal 'rdpcgcnt' and a write precharge control signal 'wtpcgcnt' in response to the burst start signal 'bststa', a precharge operating signal 'pcgact', the clock signal 'clk', a write signal 'wrt' and the burst termination signal 'bstend'. The precharge control unit 30 can be configured to sense a read or write operation from the write signal 'wrt' to change a reset timing for an inner signal generating node and change a delay value for the signal generating node to generate the read precharge control signal 'rdpcgcnt' and the write precharge control signal 'wtpcgcnt'. Each of the read precharge control signal 'rdpcgcnt' and the write precharge control signal 'wtpcgcnt', which should be activated only once by consecutive write operations, is activated twice because the reset timing for the signal generating node in the precharge control unit 30 is not properly controlled. Thus, to prevent this form occurring, the precharge control unit 30 can be configured to distinguish the read operation from the write operation and use the read precharge control signal 'rdpcgcnt' or the write precharge control signal 'wtpcgcnt' to determine the reset timing for the signal generating node.

The precharge control unit 30 can also be configured to sense the read or write operation and to variably delay the voltage of the signal generating node to stabilize the activation timing of the read precharge control signal 'rdpcgcnt' and the write precharge control signal 'wtpcgcnt'. Thus, the apparatus and methods described herein can provide stable operation.

The precharge signal generating unit 40 can be configured to generate a precharge signal 'pcg' in response to the write signal 'wrt', a section setting signal 'itset', the read precharge control signal 'rdpcgcnt' and the write precharge control signal 'wtpcgcnt'.

The burst setting unit 10 and the precharge control unit 30 will be described in below.

Figure 2:
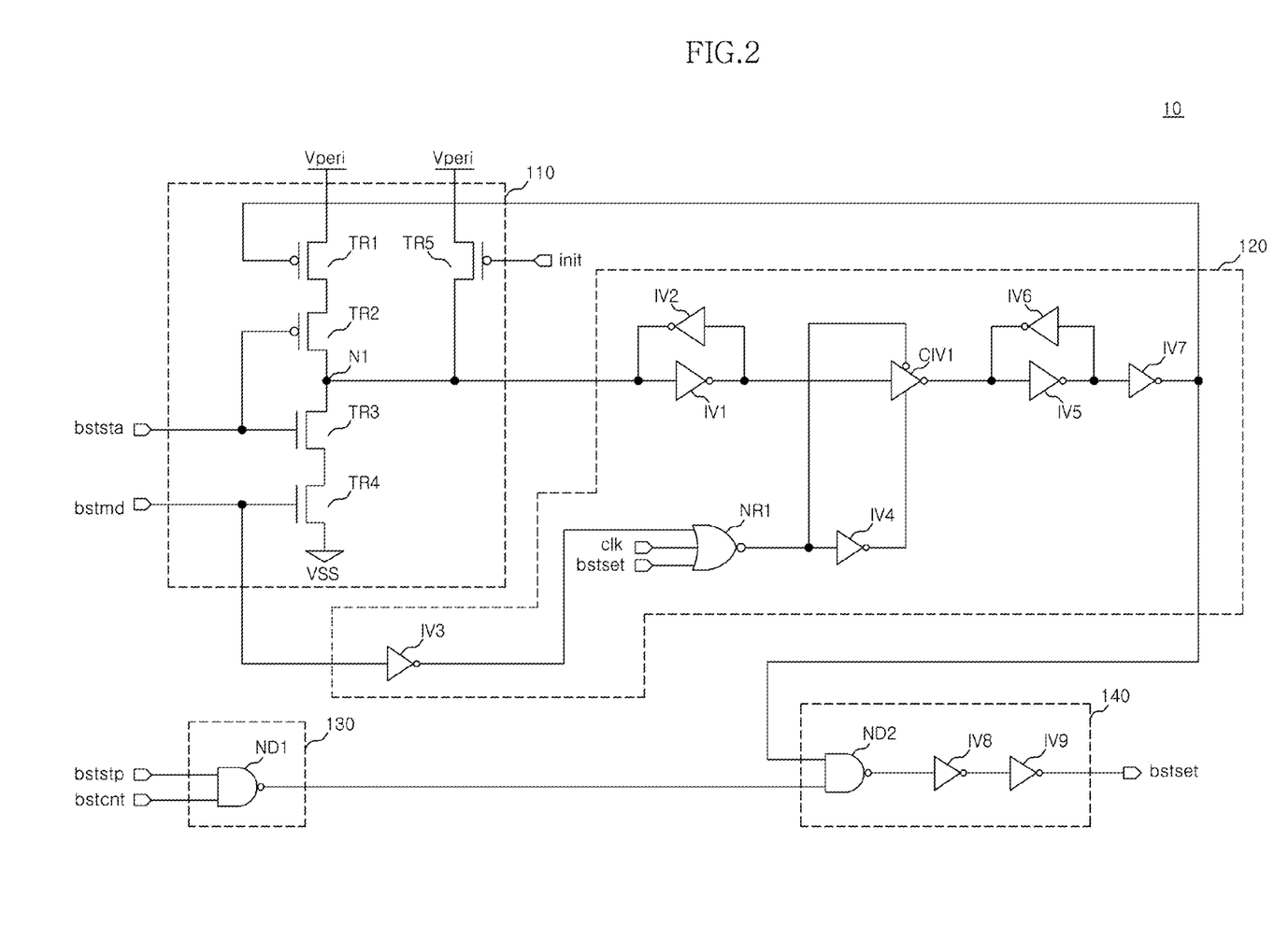
FIG. 2 is a detailed circuit diagram illustrating a burst setting unit that can be included in the circuit of FIG. 1.

Referring to FIG. 2, the burst setting unit 10 can include a first signal input section 110, a first delay section 120, a second signal input section 130 and a first signal combination section 140.

The first signal input section 110 can be configured to receive the burst start signal 'bststa', the burst mode signal 'bstmd', an initialization signal 'init' and a fed back output signal of the first delay section 120 to control the voltage of a node N1. The first signal input section 110 can include transistors TR1 to TR5.

The transistor TR1 can include a gate to which the output signal of the first delay section 120 is applied and a source to which a peripheral voltage (Vperi) is applied. The transistor TR2 can include a gate to which the burst start signal 'bststa' is applied, a source connected to the drain of the transistor TR1, and a drain connected to the node N1. The transistor TR3 can include a gate to which the burst start signal 'bststa' is applied and a drain connected to the node N1. The transistor TR4 can include a gate to which the burst mode signal 'bstmd' is applied, a drain connected to the drain of the transistor TR3, and a source connected to a ground voltage (VSS) terminal. The transistor TR5 can include a gate to which the initialization signal 'init' is applied, a source to which the peripheral voltage (Vperi) is applied, and a drain connected to the node N1.

The first delay section 120 can receive the burst mode signal 'bstmd', the clock signal 'clk' and the fed back burst setting signal 'bstset' to delay the output of a signal generated in the node N1. The first delay section 120 can include inverters IV1 to IV7, a NOR gate NR1, and a control inverter CIV1.

The inverter IV1 can receive the voltage applied to the node N1. The inverter IV2 forms a latch structure with the inverter IV1. The inverter IV3 can receive the burst mode signal 'bstmd'. The NOR gate NR1 can receive an output signal of the inverter IV3, the clock signal 'clk', and the burst setting signal 'bstset'. The inverter IV4 can receive an output signal of the NOR gate NR1. The control inverter CIV1 can be configured to invert an output signal of the inverter IV1 in response to the output signal of the NOR gate NR1 and an output signal of the inverter IV4. The inverter IV5 can receive an output signal of the control inverter CIV1. The inverter IV6 forms a latch structure with the inverter IV5. The inverter IV7 can receive an output signal of the inverter IV5.

The second signal input section 130 can be configured to receive the burst stop signal 'bststp' and the burst control signal 'bstcnt'. The second signal input section 130 can include a NAND gate ND1, which receives the burst stop signal 'bststp' and the burst control signal 'bstcnt'.

The first signal combination section 140 can be configured to combine the output signal of the first delay section 120 with an output signal of the second signal input section 130 to generate the burst setting signal 'bstset'. The first signal combination section 140 can include a second NAND gate ND2 and inverters IV8 and IV9.

The second NAND gate ND2 can receive an output signal of the inverter IV7 and an output signal of the NAND gate ND1. The inverter IV8 can be configured to receive an output signal of the NAND gate ND2. The inverter IV9 can be configured to receive an output signal of the inverter IV8 to output the burst setting signal 'bstset'.

In this example, the peripheral voltage (Vperi) is a power source of the precharge control circuit.

If a semiconductor memory apparatus including the precharge control circuit 11 is, e.g., a general SDRAM (Synchronous Dynamic Random Access Memory), then the burst mode signal 'bstmd' can, e.g., represent that a burst length is 1. If, e.g., the precharge control circuit 11 is included in a DDR SDRAM (Double Data Rate Synchronous Dynamic Random Access Memory), then the burst mode signal 'bstmd' can, e.g., represent that a burst length is 2. If the burst length is 1 in the SDRAM and the burst length is 2 in the DDR SDRAM, then a high clock frequency can lead to operational errors.

The burst stop signal 'bststp', which can, e.g., be a pulse signal, can be activated when the burst length is terminated according to a predetermined burst length. The burst control signal 'bstcnt' can be activated when the toggling of the burst stop signal 'bststp' is completed. In this example, the burst length is 1 or 2 and the burst stop signal 'bststp' and the burst control signal 'bstcnt' are inactive.

When the burst mode signal 'bstmd' is activated, the transistor TR4 is turned on. Also, when the burst start signal 'bststa' is activated, the transistor TR3 is turned on. Thus, the voltage on node N1 is at a low level. The voltage on the node N1 is then latched by the inverters IV1 and IV2 and a high level signal is output from the inverter IV1, and is transmitted to the control inverter CIV1. Since the voltage level of the output signal of the inverter IV3 is low and the voltage level of the burst setting signal 'bstset' is also low, the control inverter CIV1 is turned on only when the voltage level of the clock signal 'clk' is high. When the control inverter CIV1 is turned on, the output signal of the inverter IV7 is in a low level and the burst setting signal 'bstset' is in a high level.

Since the output signal of the first delay section 120 is at a low level, the transistor TR1 is turned on. Then, when the burst start signal 'bststa' is deactivated, the transistor TR2 is turned on and the transistor TR3 is turned off so that the voltage level of the node N1 becomes high, and the inverter IV1 continuously outputs a low level signal. Since the burst setting signal 'bstset' is at a high level, the NOR gate NR1 outputs a low level signal so that the control inverter CIV1 maintains a turn-on state. Thus, the inverter IV7 outputs a high level signal. At this time, the output signal of the NAND gate ND1 is at a high level. High level signals are input to the NAND gate ND2 so that the burst setting signal 'bstset' is at a low level.

As described above, when the burst setting signal 'bstset' is inactive, the burst setting unit 10 can generate the burst setting signal 'bstset' in response to the burst start signal 'bststa' by using the delay elements, which operate in synchronization with the clock signal 'clk', namely, the inverter IV1, the control inverter CIV1, the inverter IV5, the inverter IV7, the NAND gate ND2, the inverter IV8 and the inverter IV9. Thus, even though the frequency of the clock signal 'clk' is changed, incorrect operation is less likely to occur because the activation timing of the burst setting signal 'bstset' is controlled.

Then, when the burst setting signal 'bstset' is activated, the burst setting unit 10 does not operate in synchronization with the clock signal 'clk' and deactivates the burst setting signal 'bstset' after a predetermined time to finish the precharge operation and wait for the input of the next command.

Figure 3:
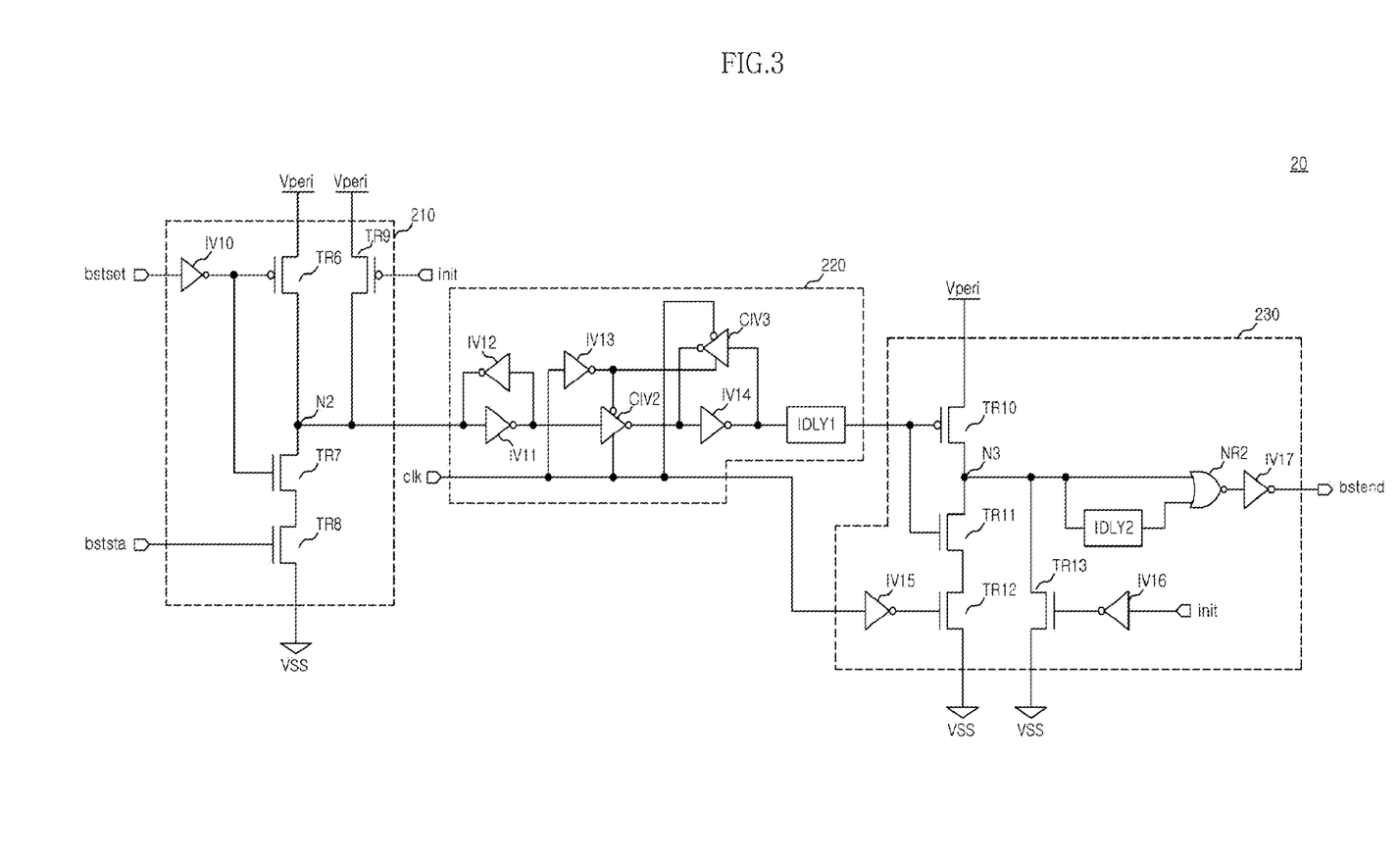
FIG. 3 is a detailed circuit diagram illustrating a burst termination unit that can be included in the circuit of FIG. 1.

Referring to FIG. 3, the burst termination unit 20 can include a third signal input section 210, a second delay section 220 and a first signal generating section 230.

The third signal input section 210 can be configured to control the voltage of a node N2 in response to the burst setting signal 'bstset', the burst start signal 'bststa' and the initialization signal 'init'. The third signal input section 210 can include an inverter IV10 and transistors TR6 to TR9.

The inverter IV10 can receive the burst setting signal 'bstset'. The transistor TR6 can include a gate to which an output signal of the inverter IV10 is applied, a source to which the peripheral voltage (Vperi) is applied, and a drain connected to the node N2. The transistor TR7 can include a gate to which an output signal of the inverter IV10 is applied and a drain connected to the node N2. The transistor TR8 can include a gate to which the burst start signal 'bststa' is applied, a drain connected to the source of the transistor TR7, and a source connected to the ground voltage (VSS) terminal. The transistor TR9 can include a gate to which the initialization signal 'init' is applied, a source to which the peripheral voltage (Vperi) is applied, and a drain connected to the node N2.

The second delay section 220 can be configured to operate in synchronization with the clock signal 'clk' to delay the output of the voltage of the node N2. The second delay section 220 can include inverters IV11 to IV14, control inverters CIV2 and CIV3 and an inverting delayer IDLY1.

The inverter IV11 can receive the voltage applied to the node N2. The inverter IV12 can form a latch structure with the inverter IV11. The inverter IV13 can receive the clock signal 'clk'. The control inverter CIV2 can invert an output signal of the inverter IV11 in response to the control of the clock signal 'clk' and an output signal of the inverter IV13. The inverter IV14 can receive an output signal of the control inverter CIV2. The control inverter CIV3 can be controlled by the clock signal 'clk' and receive the output signal of the inverter IV13. The control inverter CIV3 can form a latch structure with the inverter IV14. The inverting delayer IDLY1 can be configured to inversely delay an output signal of the inverter IV14.

The first signal generating section 230 can be configured to generate the burst termination signal 'bstend' in response to an output signal of the second delay section 220 and the clock signal 'clk'. The first signal generating section 230 can include transistors TR10 to TR13, inverters IV15 to IV17, an inverting delayer IDLY2 and a NOR gate NR2.

The transistor TR10 can include a gate to which the output signal of the second delay section 220 is applied, a source to which the peripheral voltage (Vperi) is applied, and a drain connected to a node N3. The transistor TR11 can include a gate to which the output signal of the second delay section 220 is applied and a drain connected to the node N3. The inverter IV15 can receive the clock signal 'clk'. The transistor TR12 can include a gate to which an output signal of the inverter IV15 is applied, a drain connected to the source of the transistor TR11 and a source connected to the ground voltage (VSS) terminal. The inverter IV16 can receive the initialization signal 'init'. The transistor TR13 can include a gate to which an output signal of the inverter IV16 is applied, a drain connected to the node N3, and a source connected to the ground voltage (VSS) terminal. The inverting delayer IDLY2 can be configured to inversely delay the voltage applied to the node N3. The NOR gate NR2 can receive the voltage applied to the node N3 and an output signal of the inverting delayer IDLY2. The inverter IV17 can receive an output signal of the NOR gate NR2 to output the burst termination signal 'bstend'.

In the burst termination unit 20, the voltage level of the node N2 in the third signal input section 210 can become low, when the burst setting signal 'bstset' is deactivated and the burst start signal 'bststa' is activated. Then, when the clock signal 'clk' is at a high level, the second delay section 220 can be configured to non-inversely delay the voltage of the node N2 and transmit it to the first signal generating section 230. Therefore, since the transistor TR10 of the first signal generating section 230 is turned on and the transistor TR11 of the first signal generating section 230 is turned off, the voltage level of the node N3 becomes high and the burst termination signal 'bstend' is also at a high level.

Then, when the burst termination signal 'bstend' is at a high level, the voltage level of the node N2 becomes high. When the clock signal 'clk' is in a high level, the voltage of the node N2, which is at a high level, goes low and is transmitted to the first signal generating section 230. Thus, when the clock signal 'clk' is at a low level, a low level voltage is applied to the node N3. Although the voltage level of the node N3 becomes low, the burst termination signal 'bstend' is still at a high level since the inverting delayer IDLY2 still outputs a signal of a high level for a predetermined delay time. When the output signal of the inverting delayer IDLY2 is at a low level after the predetermined delay time, the burst termination signal 'bstend' is also at a low level.

Then, when the burst setting signal 'bstset' is deactivated, the voltage of the burst termination signal 'bstend' becomes high again after the predetermined delay time. That is, the burst termination signal 'bstend' is activated in a low pulse.

Figure 4:
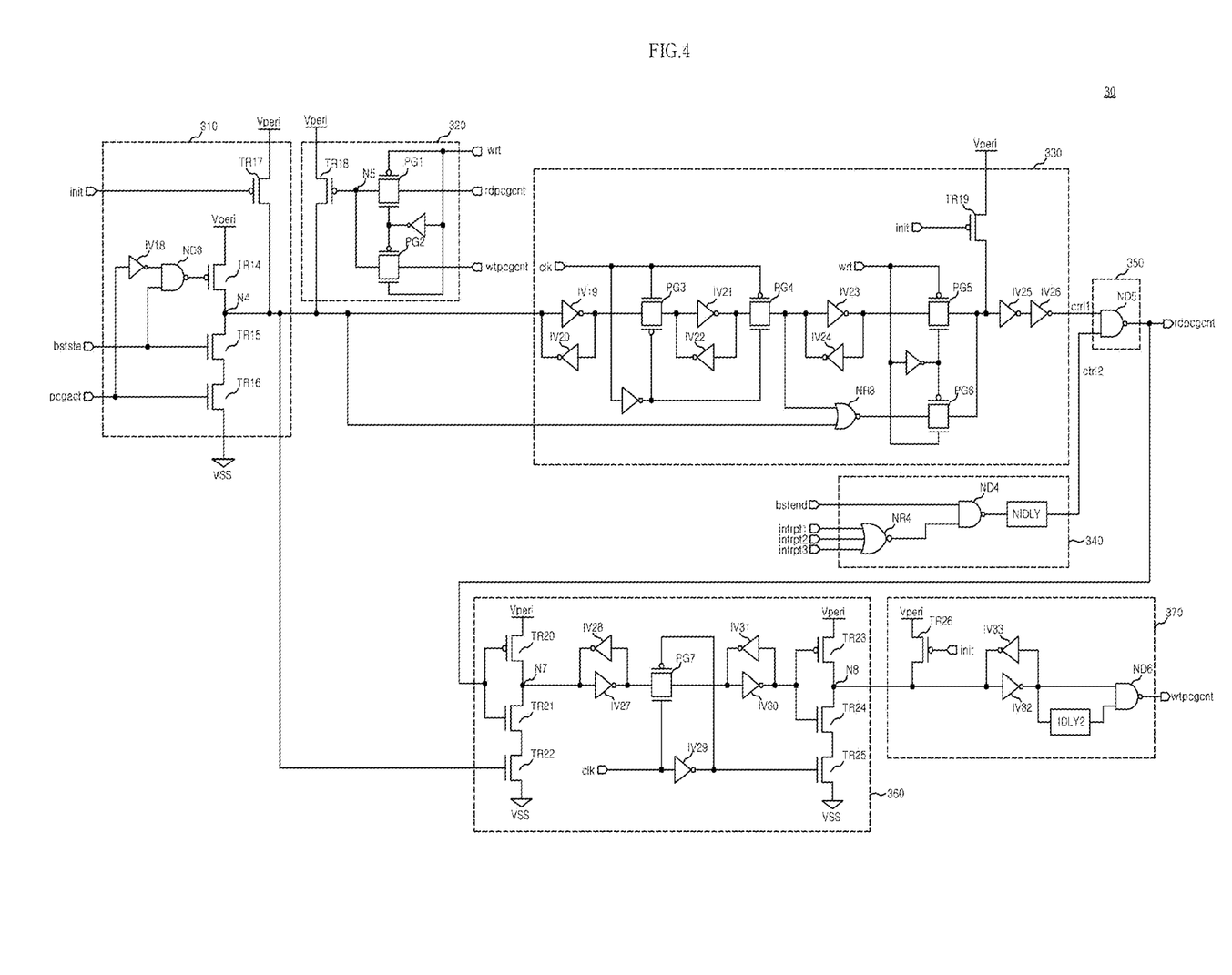
FIG. 4 is a detailed circuit diagram illustrating a precharge control unit that can be included in the circuit of FIG. 1.

Referring to FIG. 4, the precharge control unit 30 can include an operation control section 310, a reset section 320, a third delay section 330, a control section 340, a second signal combination section 350, a fourth delay section 360, and a second signal generating section 370.

The operation control section 310 can receive the burst start signal 'bststa' and the precharge operating signal 'pcgact' to control the voltage level of a node N4. The operation control section 310 can include an inverter IV18, a NAND gate ND3 and transistors TR14 to TR17.

The inverter IV18 can receive the precharge operating signal 'pcgact'. A NAND gate ND3 can receive an output signal of the inverter IV18 and the burst start signal 'bststa'. The transistor TR14 can include a gate to which an output signal of the NAND gate ND3 is applied, a source to which the peripheral voltage (Vperi) is applied, and a drain connected to the node N4. The transistor TR15 can include a gate to which the burst start signal 'bststa' is applied and a drain connected to the node N4. The transistor TR16 can include a gate to which the precharge operating signal 'pcgact' is applied, a drain connected to the source of the transistor TR15, and a source connected to the ground voltage (VSS) terminal. The transistor TR17 can include a gate to which the initialization signal 'init' is applied, a source to which the peripheral voltage (Vperi) is applied, and a drain connected to the node N4.

The reset section 320 can control the voltage level of the node N4 in response to the write signal 'wrt', the read precharge control signal 'rdpcgcnt', and the write precharge control signal 'wtpcgcnt'. The reset section 320 can include pass gates PG1 and PG2 and a transistor TR18.

The first pass gate PG1 can be configured to transmit the read precharge control signal 'rdpcgcnt' to a node N5 under control of the write signal 'wrt'. The pass gate PG2 can be configured to transmit the write precharge control signal 'wtpcgcnt' to the node N5 under control of the write signal 'wrt'. The transistor TR18 can include a gate connected to the node N5, a source to which the peripheral voltage (Vperi) is applied, and a drain connected to the node N4.

The third delay section 330 can be configured to delay the output of the voltage of the node N4 to generate a first control signal 'ctrl1' in response to the clock signal 'clk', the write signal 'wrt', and the initialization signal 'init'. The third delay section 330 can include inverters IV19 to IV26, pass gates PG3 to PG6, a NOR gate NR3, and a transistor TR19.

The inverter IV19 can receive the voltage applied to the node N4. The inverter IV20 can form a latch structure with the inverter IV19. The pass gate PG3 can be configured to pass an output signal of the inverter IV19 under control of the clock signal 'clk'. The inverter IV21 can receive an output signal of the pass gate PG3. The inverter IV22 can form a latch structure with the inverter IV21. The pass gate PG4 can be configured to pass an output signal of the inverter IV21 according to the control of the clock signal 'clk'. The inverter IV23 can receive an output signal of the pass gate PG4.

The inverter IV24 can form a latch structure with the inverter IV23. The NOR gate NR3 can receive the voltage on node N4 and the output signal of the pass gate PG4. The pass gate PG5 can be configured to transmit an output signal of the inverter IV23 to a node N6 under control of the write signal 'wrt'. The pass gate PG6 can transmit an output signal of the NOR gate NR3 to the node N6 under control of the write signal 'wrt'. The transistor TR19 can include a gate to which the initialization signal 'init' is applied, a source to which the peripheral voltage (Vperi) is applied, and a drain connected to the node N6. The inverter IV25 can receive the voltage on the node N6. The inverter IV26 can receive an output signal of the inverter IV25 to output the first control signal 'ctrl1'.

The control section 340 can be configured to generate a second control signal 'ctrl2' in response to the burst termination signal 'bstend' and a plurality of interrupt signals ('intrpt1', 'intrpt2', 'intrpt3'). The control section 340 can include a NOR gate NR4, a NAND gate ND4 and a non-inverting delayer NIDLY.

The NOR gate NR4 can receive the plurality of interrupt signal ('intrpt1', 'intrpt2', 'intrpt3'). The NAND gate ND4 can receive the burst termination signal 'bstend' and an output signal of the NOR gate NR4. The non-inverting delayer NIDLY can be configured to non-inversely delay an output signal of the NAND gate ND4 to generate the second control signal 'ctrl2'.

The second signal combination section 350 can be configured to combine the first control signal 'ctrl1' with the second control signal 'ctrl2' to generate the read precharge control signal 'rdpcgcnt'. The second signal combination section 350 can include a NAND gate ND5 that receives the first control signal 'ctrl1' and the second control signal 'ctrl2' to output the read precharge control signal 'rdpcgcnt'.

The fourth delay section 360 can be configured to delay the read precharge control signal 'rdpcgcnt' in response to the voltage of the node N4 and the clock signal 'clk'. The fourth delay section 360 can include transistors TR20 to TR25, inverters IV27 to IV31, and a pass gate PG7.

The transistor TR20 can include a gate to which the read precharge control signal 'rdpcgcnt' is applied, a source to which the peripheral voltage (Vperi) is applied, and a drain connected to a node N7. The transistor TR21 includes a gate to which the read precharge control signal 'rdpcgcnt' is applied and a drain connected to the node N7. The transistor TR22 can include a gate connected to the node N4, a drain connected to the source of the transistor TR21, and a source connected to the ground voltage (VSS) terminal. The inverter IV27 can receive the voltage of the node N7. The inverter IV28 can form a latch structure with the inverter IV27. The inverter IV29 can receive the clock signal 'clk'. The pass gate PG7 can be configured to pass an output signal of the inverter IV27 under the control of the clock signal 'clk' and an output signal of the inverter IV29. The inverter IV30 can receive an output signal of the pass gate PG7. The inverter IV31 can form a latch structure with the inverter IV30. The transistor TR23 can include a gate to which an output signal of the inverter IV30 is applied, a source to which the peripheral voltage (Vperi) is applied, and a drain connected to a node N8. The transistor TR24 can include a gate to which the output signal of the inverter IV30 is applied and a drain connected to the node N8. The transistor TR25 can include a gate to which an output signal of the inverter IV29 is applied, a drain connected to the source of the transistor TR24, and a source connected to the ground voltage (VSS) terminal.

The second signal generating section 370 can be configured to generate the write precharge control signal 'wtpcgcnt' from an output signal of the fourth delay section 360 in response to the initialization signal 'init'. The second signal generating section 370 can include a transistor TR26, inverters IV32 and IV33, an inverting delayer IDLY2, and a NAND gate ND6.

The transistor TR26 can include a gate to which the initialization signal 'init' is applied, a source to which the peripheral voltage (Vperi) is applied, and a drain connected to the node N8. The inverter IV32 can be configured to receive the voltage of the node N8. The inverter IV33 can form a latch structure with the inverter IV32. The inverting delayer IDLY2 can be configured to inversely delay an output signal of the inverter IV32. The NAND gate ND6 can receive the output signal of the inverter IV32 and an output signal of the inverting delayer IDLY2 to output the write precharge control signal 'wtpcgcnt'.

The signal generating node in the precharge control unit 30, which is described above, can be referred to as node N4 in the embodiments described herein. In the precharge control unit 30, the voltage level of the node N4 becomes low when the precharge operating signal 'pcgact', which commands the start of the precharge operation, is activated after the read operation and the burst start signal 'bststa' is activated. In this case, since the write signal 'wrt' is deactivated, the pass gate PG5 is turned on. Thus, the voltage of the node N4 can be inversely delayed in synchronization with the clock signal 'clk' to be transmitted as the first control signal 'ctrl1' of a high level to the NAND gate ND5 of the second signal combination section 350.

At this time, when the burst termination signal 'bstend' is activated, the second control signal 'ctrl2' in a transmitted as a high pulse to the NAND gate ND5 of the second signal combination section 350 after a delay time, which is given to the output signal of the NAND gate ND4 by the non-inverting delayer NIDLY. The read precharge control signal 'rdpcgcnt' is thereby activated in a low pulse. The read precharge control signal 'rdpcgcnt' can then be transmitted to the reset section 320 to reset the node N4.

Then, the read precharge control signal 'rdpcgcnt' is transmitted to the fourth delay section 360. The fourth delay section 360 can be configured to delay the read precharge control signal 'rdpcgcnt' in synchronization with the clock signal 'clk' and transmit the read precharge control signal 'rdpcgcnt', as a low pulse, to the node N8. The second signal generating section 370 can be configured to control the pulse width of the read precharge control signal 'rdpcgcnt' and output the pulse width controlled signal as the write precharge control signal 'wtpcgcnt'.

Delaying the read precharge control signal 'rdpcgcnt' to generate the write precharge control signal 'wtpcgcnt' allows the waiting time for the write operation to be considered in the precharge operation after the read operation.

Meanwhile, when the precharge operation starts after the write operation, the voltage of the write signal 'wrt' becomes high. Thus, since the precharge operating signal 'pcgact' and the burst start signal 'bststa' are activated, the voltage of the node N4, which is at a low level, is transmitted to the NOR gate NR3. At this time, since the output terminal of the pass gate PG4 maintains a low level voltage due to the latch structure of the inverter IV24 and the inverter IV23, the voltage of the output signal of the NOR gate NR3 becomes high. In this case, since the pass gate PG6 is turned on, the first control signal 'ctrl1' is activated at a high level.

The subsequent operation can be the same as the precharge operation after the read operation. During a precharge operation after a write operation, the read precharge control signal 'rdpcgcnt' and the write precharge control signal 'wtpcgcnt' are activated in the same manner as in a precharge operation after a read operation.

Meanwhile, during a precharge operation after a write operation, when the pass gate PG2 of the reset section 320 is turned on so that the write precharge control signal 'wtpcgcnt' resets the node N4 to a high level, the voltage of the node N4 is transmitted as the first control signal 'ctrl1' to the second signal combination section 350 via the NOR gate NR3, the pass gate PG6, the inverter IV25, and the inverter IV26. That is, during a precharge operation after a write operation, the first control signal 'ctrl1' is deactivated at a low level faster than at the precharge operation after the read operation.

Therefore, since the first control signal 'ctrl1' during a precharge operation after a write operation is deactivated faster than during a precharge operation after a read operation, erroneous operation due to the write precharge control signal 'wtpcgcnt' being activated twice due to a mismatch with the activation timing of the burst termination signal 'bstend' can be prevented.

Figure 5:
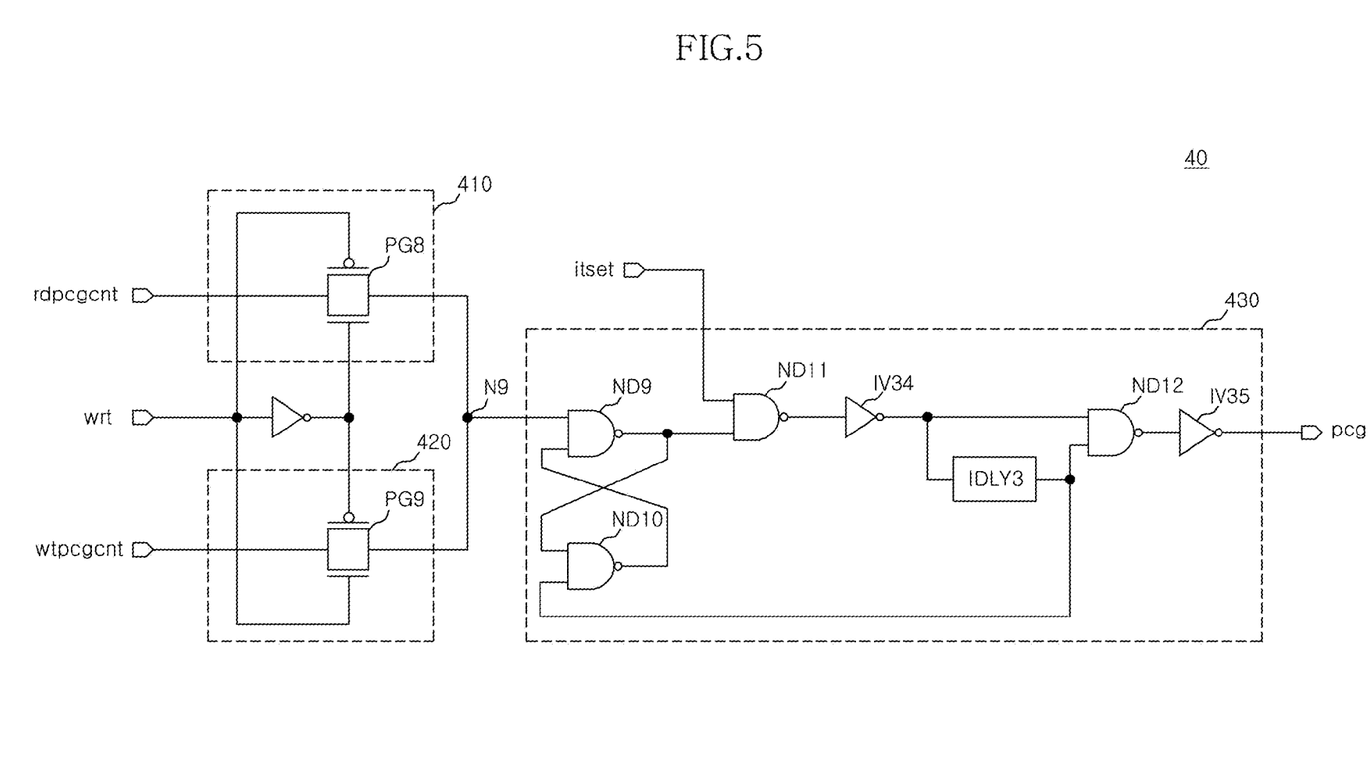
FIG. 5 is a detailed circuit diagram illustrating a precharge signal generating unit that can be included in the circuit of FIG. 1.

Referring to FIG. 5, the precharge signal generating unit 40 can include a first switching section 410, a second switching section 420 and a third signal generating section 430.

The first switching section 410 can be configured to transmit the read precharge control signal 'rdpcgcnt' to a node N9 in response to the write signal 'wrt'. The first switching section 410 can include an pass gate PG8, which receives the read precharge control signal 'rdpcgcnt' and is turned on when the write signal 'wrt' is deactivated.

The second switching section 420 can be configured to transmit the write precharge control signal 'wtpcgcnt' to the node N9 in response to the write signal 'wrt'. The second switching section 420 can include a pass gate PG9, which receives the write precharge control signal 'wtpcgcnt' and is turned on when the write signal 'wrt' is activated.

The third signal generating section 430 can be configured to generate the precharge signal 'pcg' from the signal transmitted to the node N9 in response to the section setting signal 'itset'. The third signal generating section 430 can include NAND gates ND9 to ND12, inverters IV34 and IV35, and an inverting delayer IDLY3.

The NAND gate ND9 can be configured to receive the signal generated at the node N9 and an output signal of the NAND gate ND10. The NAND gate ND10 can receive an output signal of the NAND gate ND9 and an output signal of the inverting delayer IDLY3. The NAND gate ND11 can receive the output signal of the NAND gate ND9 and the section setting signal 'itset'. The inverter IV34 can receive an output signal of the NAND gate ND11. The inverting delayer IDLY3 can receive an output signal of the inverter IV34. The NAND gate ND12 can receive an output signal of the inverter IV34 and the output signal of the inverting delayer IDLY3. The inverter IV35 can receive an output signal of the NAND gate ND12 to output the precharge signal 'pcg'.

The section setting signal 'itset' can be configured to define the timing of the precharge operation. At the precharge operation after the read operation, the read precharge control signal 'rdpcgcnt' can be transmitted to the node N9, and during a precharge operation after a write operation, the write precharge control signal 'wtpcgcnt' can be transmitted to the node N9. Then, the third signal generating section 430 can be configured to combine the signal transmitted to the node N9 in a pulse with the section setting signal 'itset' and control the pulse width of the combined signal to output the precharge signal 'pcg'.

In the conventional precharge control circuit, an error can occur in that a pulse signal is transmitted twice to the equivalent of node N9 when consecutive write operations are performed, which can result in a precharge signal being activated too fast, thereby causing a loss in the waiting time for the write operation. In the apparatus and methods described herein, such erroneous operation is less likely to occur.

As described above, the precharge control circuit 11 improves adaptability to the change of a clock frequency to reduce the occurrence of erroneous operation due to a high clock frequency by controlling the activation timing of a burst setting signal according to the change of the clock frequency.

Also, circuit 11 can enable a read precharge control signal by enabling a first control signal in synchronization with a clock at the time of consecutive write operations and deactivate the first control signal quickly after resetting a signal generation node so that the erroneous activation of the read precharge control signal is prevented. Accordingly, the precharge control circuit 11 is capable of properly coping with a high clock frequency and stably generating a precharge signal during consecutive write operations.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A precharge control circuit in a semiconductor memory apparatus, comprising:
    a burst setting unit comprising a plurality of delay elements, the burst setting unit configured to control a state of a burst setting signal using the plurality of delay elements in response to a burst start signal, wherein the plurality of delay elements are configured to operate in synchronization with a clock signal when the burst setting signal is deactivated;
    a burst termination unit configured to generate a burst termination signal in response to the burst setting signal;
    a precharge control unit configured to generate a read precharge control signal and a write precharge control signal in response to the burst termination signal; and
    a precharge signal generating unit configured to generate a precharge signal using the read precharge control signal or the write precharge control signal according to a read or write operation.

2. The precharge control circuit of claim 1, wherein the burst setting unit is configured to receive, as a feedback signal, the burst setting signal and to control the state of the burst setting signal by delaying an output of a voltage, which is generated through an activation of the burst start signal, in synchronization with the clock signal when the burst setting signal is deactivated and by delaying the output of the voltage using a delay value of the delay elements when the burst setting signal is activated.

3. The precharge control circuit of claim 2, wherein the burst setting unit includes:
    a delay section for delaying;
    a first signal input section configured to receive the burst start signal, a burst mode signal, an initialization signal, and an output signal of the delay section to control a voltage level of a first node, wherein the delay section is configured to receive the burst mode signal, the clock signal, and the fed back burst setting signal to delay an output of a voltage generated at the first node;
    a second signal input section for receiving the burst termination signal and a burst control signal; and
    a signal combination section for combining an output signal of the delay section and an output signal of the second signal input section to generate the burst setting signal.

4. The precharge control circuit of claim 1, wherein the burst termination unit is configured to delay the burst setting signal in synchronization with the clock signal when the burst start signal is activated and controls a pulse width to generate the burst termination signal.

5. The precharge control circuit of claim 4, wherein the burst termination unit includes:
    a first node;
    a signal input section configured to control a voltage level of the first node in response to the burst setting signal, the burst start signal, and an initialization signal;
    a delay section configured to delay an the output of a voltage on the first node in synchronization with the clock signal; and
    a signal generating section configured to generate the burst termination signal in response to an output signal of the delay section and the clock.

6. The precharge control circuit of claim 1, wherein the precharge control unit is configured to variably delay an output of a voltage generated based on the burst start signal and a precharge operating signal in response to a write signal defining the read or write operation and combine the voltage with the burst termination signal to generate the read precharge control signal and the write precharge control signal.

7. The precharge control circuit of claim 6, wherein the precharge control unit includes:
    an operation control section configured to receive the burst start signal and the precharge operation signal to control a voltage level of a first node;
    a reset section configured to control the voltage level of the first node in response to the write signal, the read precharge control signal, and the write precharge control signal;
    a first delay section configured to delay an output of a voltage of the first node in response to the clock signal, the write signal, and an initialization signal to generate a first control signal;
    a control section configured to generate a second control signal in response to the burst termination signal and a plurality of interrupt signals;
    a signal combination section configured to combine the first control signal and the second control signal to generate the read precharge control signal;
    a second delay section configured to delay the read precharge control signal in response to the voltage of the first node and the clock; and
    a signal generating section configured to generate the write precharge control signal from an output signal of the second delay section in response to the initialization signal.

8. The precharge control circuit of claim 6, wherein the precharge signal generating unit is configured to combine the read precharge control signal with a section setting signal when the write signal is deactivated and combine the write precharge control signal with the section setting signal when the write signal is activated to generate the precharge signal.

9. The precharge control circuit of claim 8, wherein the precharge signal generating unit includes:
    a first switching section configured to transmit the read precharge control signal to a first node in response to the write signal;
    a second switching section configured to transmit the write precharge control signal to the first node in response to the write signal; and
    a signal generating section configured to generate the precharge signal from a signal transmitted to the first node in response to the section setting signal.

10. A precharge control circuit in a semiconductor memory apparatus, comprising:
    a first node;
    a burst setting unit configured to generate a burst setting signal in response to a burst start signal;

a burst termination unit configured to generate a burst termination signal in response to the burst setting signal;

a precharge control unit configured to variably delay an output of a voltage of the first node, generated in response to the burst start signal, according to a read or write operation and to generate a read precharge control signal and a write precharge control signal by combining the burst termination signal and the voltage output from the first node; and a precharge signal generating unit configured to generate a precharge signal using the read precharge control signal or the write precharge control signal according to the read or write operation.

11. The precharge control circuit of claim 10, wherein the burst setting unit is configured to receive the burst setting signal as a feedback signal and controls the state of the burst setting signal by delaying an output of a voltage, which is generated through an activation of the burst start signal, in synchronization with a clock signal when the burst setting signal is inactivated and delaying the output of the voltage using a delay value of the delay elements when the burst setting signal is activated.

12. The precharge control circuit of claim 11, wherein the burst setting unit includes:
a delay section;
a first signal input section configured to receive the burst start signal, a burst mode signal, an initialization signal and a fed back output signal of the delay section to control a voltage level of a second node, wherein the delay section is configured to receive the burst mode signal, the clock signal and, a feedback signal of the burst setting signal to delay an output of a voltage generated from the second node;
a second signal input section for receiving the burst termination signal and a burst control signal; and
a signal combination section for combining an output signal of the delay section and an output signal of the second signal input section to generate the burst setting signal.

13. The precharge control circuit of claim 10, wherein the burst termination unit is configured to delay the burst setting signal in synchronization with a clock signal when the burst start signal is activated and controls a pulse width to generate the burst termination signal.

14. The precharge control circuit of claim 13, wherein the burst termination unit includes:
a signal input section configured to control a voltage level of a second node in response to the burst setting signal, the burst start signal and an initialization signal;
a delay section configured to delay an output of a voltage of the second node in synchronization with the clock signal; and
a signal generating section configured to generate the burst termination signal in response to an output signal of the delay section and the clock.

15. The precharge control circuit of claim 10, wherein the precharge control unit is configured to reset a voltage of the first node in response to a write signal defining the read or write operation.

16. The precharge control circuit of claim 15, wherein the precharge control unit includes:
an operation control section configured to receive the burst start signal and a precharge operation signal to control a voltage level of the first node;
a reset section configured to control the voltage level of the first node in response to the write signal, the read precharge control signal, and the write precharge control signal;
a first delay section configured to delay an output of a voltage of the first node in response to a clock signal, the write signal, and an initialization signal to generate a first control signal;
a control section configured to generate a second control signal in response to the burst termination signal and a plurality of interrupt signals;
a signal combination section configured to combine the first control signal and the second control signal to generate the read precharge control signal;
a second delay section configured to delay the read precharge control signal in response to the voltage of the first node and the clock; and
a signal generating section configured to generate the write precharge control signal from an output signal of the second delay section in response to the initialization signal.

17. The precharge control circuit of claim 16, wherein the first delay section is configured to delay the output of the voltage of the first node in synchronization with the clock signal when the write signal is deactivated to generate the first control signal and delay the output of the voltage of the first node using a delay value of delay elements when the write signal is activated to generate the first control signal.

18. The precharge control circuit of claim 15, wherein the precharge signal generating unit is configured to combine the read precharge control signal with a section setting signal when the write signal is deactivated and combine the write precharge control signal with the section setting signal when the write signal is activated to generate the precharge signal.

19. The precharge control circuit of claim 18, wherein the precharge signal generating unit includes:
a first switching section configured to transmit the read precharge control signal to a second node in response to the write signal;
a second switching section configured to transmit the write precharge control signal to the first node in response to the write signal; and
a signal generating section configured to generate the precharge signal from a signal transmitted to the second node in response to the section setting signal.

* * * * *